(12) United States Patent
Bramsløw et al.

(10) Patent No.: US 8,526,624 B2
(45) Date of Patent: Sep. 3, 2013

(54) HEARING AID

(75) Inventors: Lars Bramsløw, Smørum (DK); Anders Højsgaard Thomsen, Smørum (DK)

(73) Assignee: Oticon A/S, Smorum (DK)

( * ) Notice: Subject to any disclaimer, the term of this patent is extended or adjusted under 35 U.S.C. 154(b) by 0 days.

(21) Appl. No.: 13/425,200

(22) Filed: Mar. 20, 2012

(65) Prior Publication Data

US 2012/0177205 A1    Jul. 12, 2012

Related U.S. Application Data

(62) Division of application No. 12/076,656, filed on Mar. 20, 2008, now Pat. No. 8,165,328.

(30) Foreign Application Priority Data

Apr. 11, 2007    (EP) ..................................... 07105971

(51) Int. Cl.
*H04R 25/00*    (2006.01)

(52) U.S. Cl.
USPC ........................................................ 381/23.1

(58) Field of Classification Search
USPC ................................................ 381/312–331
See application file for complete search history.

(56) References Cited

U.S. PATENT DOCUMENTS

| | | | |
|---|---|---|---|
| 4,400,590 A | | 8/1983 | Michelson |
| 4,460,871 A | | 7/1984 | Orban |
| 5,479,522 A | * | 12/1995 | Lindemann et al. ......... 381/23.1 |
| 5,608,803 A | | 3/1997 | Magotra et al. |
| 5,757,932 A | | 5/1998 | Lindemann et al. |
| 6,198,830 B1 | | 3/2001 | Holube et al. |
| 6,549,633 B1 | * | 4/2003 | Westermann ................. 381/312 |
| 6,628,795 B1 | | 9/2003 | Ludvigsen |
| 2004/0190734 A1 | | 9/2004 | Kates |
| 2006/0159285 A1 | * | 7/2006 | Reber et al. ..................... 381/98 |

FOREIGN PATENT DOCUMENTS

| | | |
|---|---|---|
| EP | 1 465 456 A2 | 10/2004 |
| WO | WO 98/18294 A1 | 10/1997 |
| WO | WO 03/081947 A1 | 10/2003 |

* cited by examiner

*Primary Examiner* — David Vu
*Assistant Examiner* — Jonathan Han
(74) *Attorney, Agent, or Firm* — Birch, Stewart, Kolasch & Birch, LLP

(57) ABSTRACT

A hearing aid includes an audio signal input device, a signal processor and a signal output device which presents a processed audio signal perceivable as sound to an ear of a user. The signal processor includes fast acting level estimators and slow acting level estimators. A communication link between two hearing aids at each ear of a user allows the transmission between the two hearing aids of level estimates from the slow acting level estimators.

16 Claims, 11 Drawing Sheets

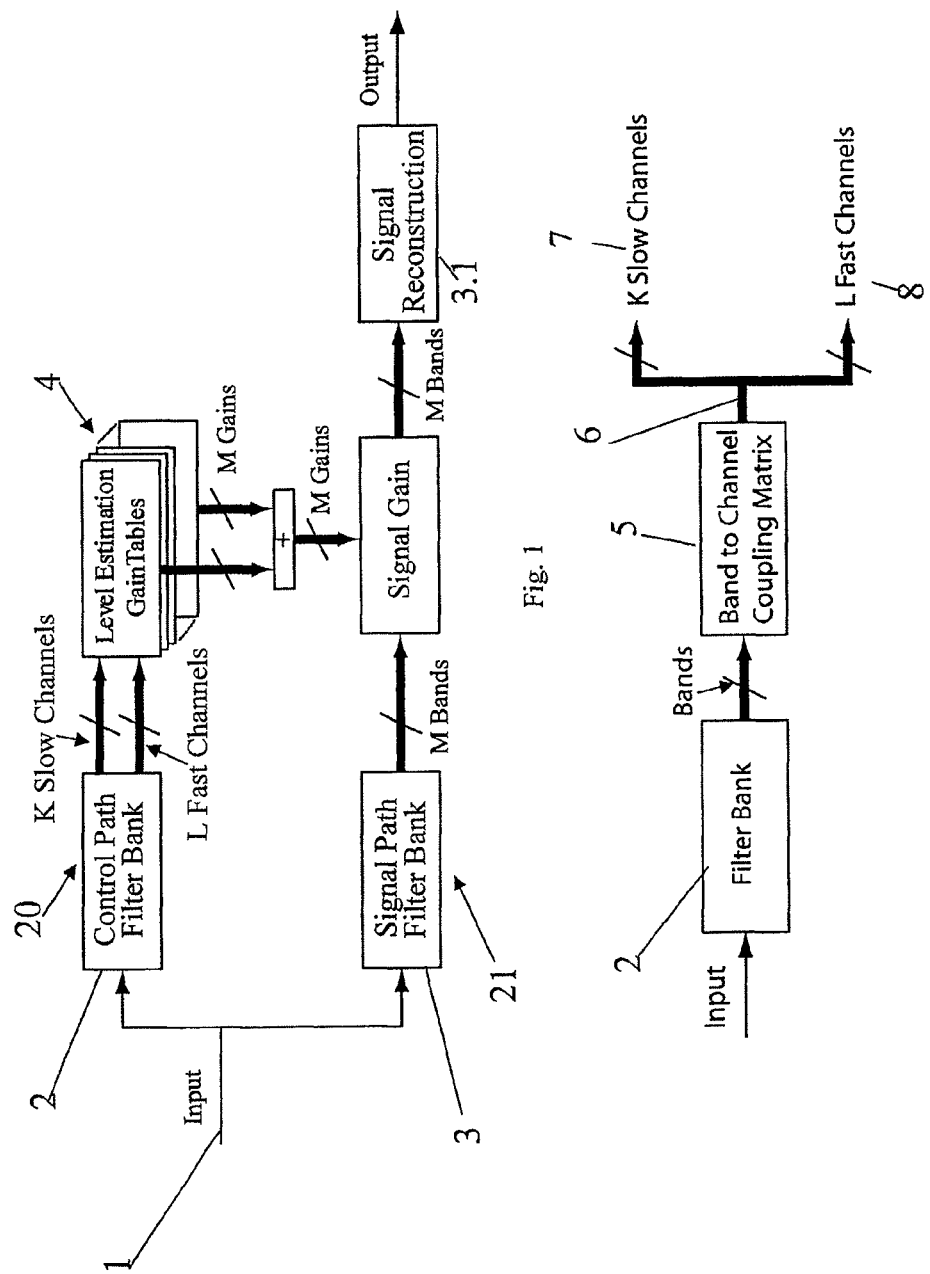

US 8,526,624 B2

HEARING AID

AREA OF THE INVENTION

This application is a Divisional of application Ser. No. 12/076,656, filed on Mar. 20, 2008, now U.S. Pat. No. 8,165,328 and for which priority is claimed under 35 U.S.C. §120. This application claims priority of EP Application No. 07105971.1 filed on Nov. 4, 2007, respectively, under 35 U.S.C. §119; the entire contents of each of the above applications is hereby incorporated by reference.

The invention regards a hearing aid with audio compression means.

BACKGROUND OF THE INVENTION

A characteristic of ordinary perceptual hearing loss (sensorineural loss) is that the threshold of hearing is elevated, whereas the discomfort level is almost normal. This corresponds to a reduction in useful input dynamic range, which is also termed 'recruitment'. The method for compensation of this deficit is to apply compression in the hearing aid. Compression is the most important signal processing used in modern hearing instruments. It addresses a number of issues such as:

Compensates the recruitment, which means 'normalizing' the dynamic range of the ear by matching the input dynamic range of the real-world to the restricted dynamic range of the client.

Adjusts different listening situations, both very soft and very loud, to be audible and yet never uncomfortably loud.

Enhances weak passages in the speech signal when in noisy situations. This can improve the speech intelligibility in noise.

Further, multi-channel compression in separate frequency bands may reduce interaction between different signals at different frequencies.

The efficacy of the solution to all these issues depends on a number of compression parameters which must be carefully selected according to the main goal of the compression. Important parameters are compression kneepoint, compression ratio and time constants (attack & release). There are also a number of drawbacks to traditional compression:

Compression distortion—poor sound quality due to the squeezing of the dynamic range. I.e. the signal sounds 'squeezed' or 'flat'. This is mostly the case for fast-acting compression, i.e. using short time constants for attack & release.

Pumping due to slow release from compression. This means that the softer sounds are suppressed for some time following a loud sound, while the gain is increased again (release). This is an effect of long release time constants.

Poor protection against sudden loud sounds—this is an effect of slow time constants for attack.

Reduction of temporal contrast in the signal, i.e. the fast level variations—this may reduce speech intelligibility.

In the case of multi-channel compression, the spectral contrast is also reduced which may reduce speech intelligibility. Furthermore the dynamic changes in timbre are perceived as unstable sound, and thus reduced sound quality.

A number of solutions to the disadvantages have been proposed and may patents written, e.g. Oticon's OGLE compressor by Neumann (WO 2003081947 A1), Ludvigsen (U.S. Pat. No. 6,628,795), and Salmi & Scheller (WO 9818294 A1). A typical solution is to combine fast and slow time constants and possibly make the level dependent, e.g. slow time constants for low levels and fast time constants for high levels. From EP1465456 a signal processing system, such as a hearing aid system is known, adapted to enhance binaural input signals. From US 2004/0190734 A1 a multi-channel signal processing system adapted to provide binaural compressing of tonal inputs is provided.

SUMMARY OF THE INVENTION

According to the invention a hearing aid is provided comprising an audio signal input device, a signal processor a signal output device which presents a processed audio signal perceivable as sound to an ear of a user, where the signal processor comprises fast acting level estimators and slow acting level estimators wherein the fast acting level estimators has attack time constants around 10 ms, and release time constants in the range from 25 ms to 250 ms, and are implemented in a number of channels not exceeding 8 and preferably 4 channels, the slow acting level estimators have attack time constants around 10 ms, and release time constants which are four to five times longer than the release time constants of the fast acting level estimators (4.8), and are implemented in a number of channels comprising no less than 10 and preferably 16 channels.

Thereby the present invention is an extension of the basic compression principle. The system combines slow, many-channel compression using high compression ratio with fast, few-channel compression using low compression ratio. These multiple compression systems use separate gain tables (unlike previous proposals) and may be combined in either parallel or serial fashion. There is also the option to let the fast compressor act on the difference between current input level and the slow level estimate from the slow compressor. The result for the listener is slow, high-resolution accommodation of the changing sound levels in real world combined with fast, low-resolution accommodation of the speech dynamics in a stable environment. The time constants of the level estimators determines whether the compressor is a fast compressor or a slow compressor. The fast and slow level estimators are implemented in channels. A channel is defined as a part of the input signal comprising at least one frequency range supplied by a band split filter. A channel may comprise several frequency ranges, adjacently placed on the frequency axis or from different places on the frequency axis. The number of channels with slow acting level estimators may be chosen in the range between 10 and 16, and in a preferred embodiment of the invention 15 channels are used.

Benefits for the client due to the new type of compression:

The system is perceived as more linear in simple and complex environments where the level is stable, which results in less compression distortion and thus better sound quality and possible speech intelligibility.

Comfortable by providing proper loudness in all environments.

The tradeoff between slow and fast compression can be regulated according to the cognitive skills of the client. The clients with higher cognitive skills can have a faster-acting compression and/or a higher amount of fast compression giving them better opportunity to 'listen in the dips'.

Less reduction of spectral and temporal cues.

Fast and slow compression can be set up input level-dependent, to use slow compression for low input levels (good SNR for speech) and fast compression for higher input levels (poor SNR for speech) to optimize the output SNR of the compression system for better speech intelligibility.

In the following the term ipse lateral is used to designate that side of the head whereto a hearing aid in question is associated in order to provide amplified sound signals for the ear at this side, where the term contra lateral designates the opposite side and the contra lateral hearing aid designates the hearing aid placed at the ear on this side.

In an embodiment of the invention further, a communication link is provided operable to transmit and receive data to/from a second similar contralaterally placed hearing aid providing sound to a contra lateral ear of a user, wherein the binaural link is operative to transmit level estimates from the slow level estimators (4.7) in the two hearing aids to the contralaterally placed hearing aid whereby further a summation point is provided in each hearing aid operative to combine the level estimates of the of the ipse lateral hearing aid with the level estimates of the contra lateral hearing aid, received via the binaural link, according to a summation function, preferably comprising a linear combination.

This will provide the sensation of a synchronized automatic volume control. Preferably a wireless link is established between the two hearing aids.

Benefits from the wireless link and transmission of level estimates between the hearing aids are:
- A more stable spatial sound image.
- Potential for improved speech intelligibility when signal and noise are spatially separated.
- More degrees of freedom to set kneepoints, compression ratios and time constants, thus avoiding some of the usual tradeoffs.
- More 'handles' to address interaction issues with other features, e.g. interaction with DFC (feedback cancellation) and noise reduction.

It is further preferred embodiment according to the invention, only level estimates in frequency bands comprising frequencies above 1500 Hz are transmitted between the ipse lateral hearing aid and a contra lateral hearing aid and only for these bands the mean values are calculated and used for the setting of gain values.

A compression system according to the invention generally comprises the signal processor wherein the following elements are provided:
- a signal path having a synthesis filter operative to provide gain modification in frequency bands and
- a control path having a filter operative to split the input signal into frequency bands and level estimators operative to estimate signal levels in channels each comprising at least one frequency band wherein
- the gain modifications in the synthesis filter in the signal path are controlled by the estimated signal levels in the control path.

In a preferred embodiment the filter means of the signal control path comprise the following elements:
- a first filter operative to effect a band split operation of the input signal into a number of frequency bands, no less than 10 and preferably comprising 16 frequency bands and
- a further filter operative to effect a band split operation of the input signal into a number of frequency bands not exceeding 8 bands and preferably 4 bands in parallel with the first filter means.

By this architecture of the signal processing means, it becomes possible to make independent gain estimations both in a narrowband and thus very precise manner and to make gain estimations with very fast attack times in broader bands.

In a further preferred embodiment the filter means of the signal control path comprise:
- a first filter operative to effect a band split operation of the input signal into a number of frequency bands, no less than 10 and preferably comprising 16 frequency bands and
- a band grouping matrix operative to combine the frequency bands from the first filter into
  - a first group of channels spanning the desired frequency range of the output signal and comprising no more than 8 and preferably comprising 4 channels and,
  - a second group of channels spanning the desired frequency range of the output signal comprising no less than 10 and preferably comprising 16 channels.

These channel sets are input to a further block which consists of level estimators and gain lookup tables. In this architecture the two groups of channels will comprise signals which have been treated in one and the same filter, and they are thus aligned in phase and have the same delay. The two control path parts are more thoroughly described in the next sections.

BRIEF DESCRIPTION OF THE DRAWINGS

FIG. 1: Multi-compressor system overview,
FIG. 2: One filter bank solution for the control path.

DESCRIPTION OF A PREFERRED EMBODIMENT

Figure 13:
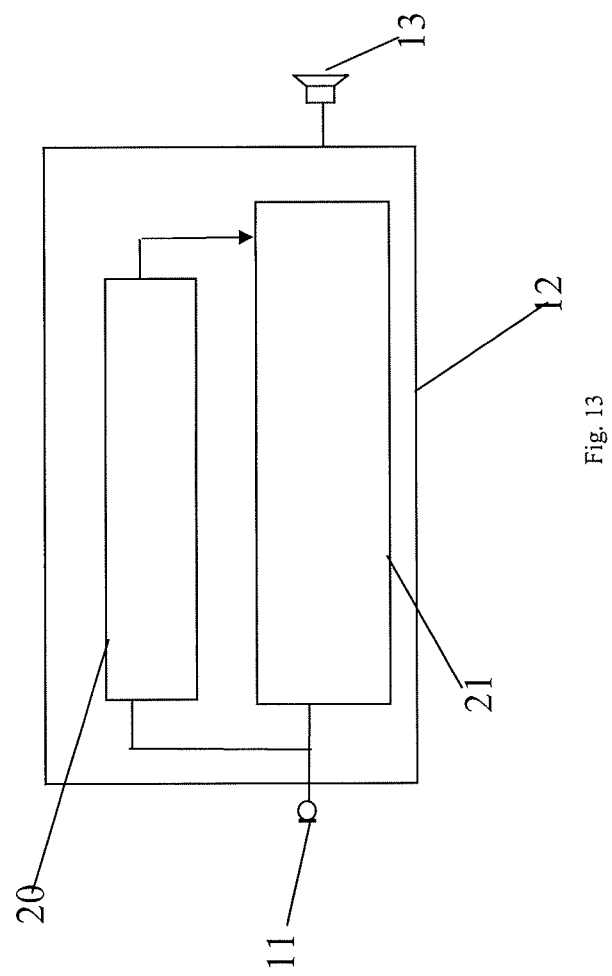
FIG. 13: Schematic overview of a hearing aid according to the invention.

A system overview is given in FIGS. 1 and 13. The input signal 1 is provided from one or more microphones 11 as shown in FIG. 13. The signal processor 12 comprises a control path 20 and a signal path 21. As seen in FIG. 1 the control path 20 comprise level estimators 4 working in a number of channels each comprising one or more frequency bands, and the provided levels are used to calculate the desired gain in each channel. In the hearing aid processor of FIG. 1 there are K so called Slow Channels and L so called Fast Channels whereby the fast and slow refers to the time constants employed by the level estimators of the respective channels. The gains are translated into filter coefficients which are served at a filter in the signal path 21 in order to provide the frequency shaped output to aid the user in overcoming his hearing disorder. The blocks Control Path Filter Bank 2 and Level Estimation Gain Tables 4 in FIG. 1 are described in more detail with reference to FIGS. 2 and 3 below.

Figure 3:
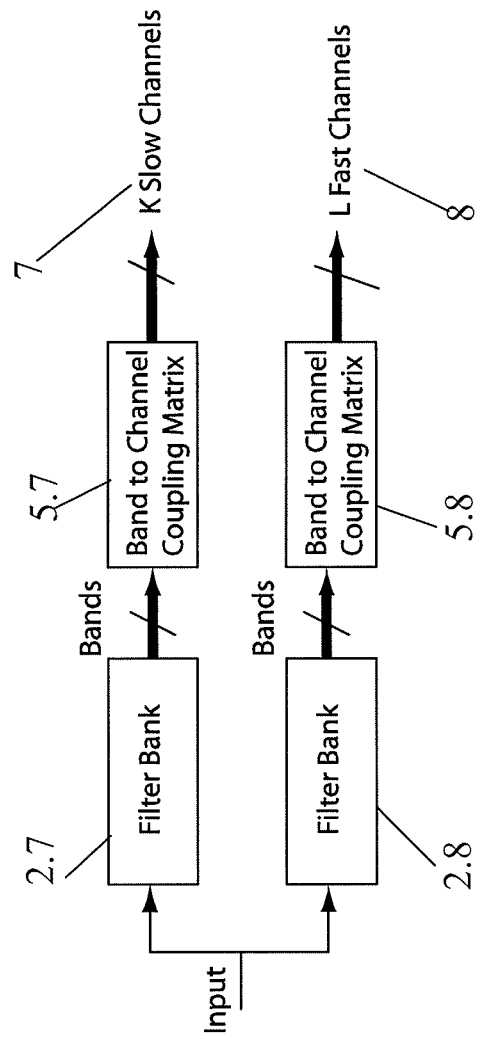
FIG. 3: Two filter bank solution for the control path.

The control path filter bank 2 can be implemented using one filter bank as shown in FIG. 2 or two filter banks 2.7; 2.8 as shown in FIG. 3. The system may also have more filter banks producing more channel sets, but in the embodiments here, two channel sets, namely K slow channels and L fast channels are described. K and L are integers, and in a preferred embodiment K is set to 16 and L is set to 4, however these numbers may vary according to the actual implementation of the invention in a hearing aid.

The task of the filter bank(s) 2 is to split the input signal into a set of frequency bands. A band-to-channel coupling matrix 5 is used to couple the frequency bands to a set of channels 6. This implies that the number of frequency bands should be at least equal to the number of channels. The coupling matrix may be used to obtain channels which overlap in frequency.

The one filter bank solution can be used when it is desired that there be no difference in filter bank design requirements (for example delay) between the slow channels 7 and the fast channels 8. This solution is illustrated in FIG. 2.

The two filter bank solution can be used when there are different design requirements for the slow channels 7 and the fast channels 8. In that case the filter bank 2.7 for the slow channels 7 is designed independent from the filter bank 2.8 for the fast channels 8 and they may have different requirements regarding speed and number of bands. This solution is illustrated in FIG. 3. Also here it can be seen that the bands from each of the filter banks 2.7 and 2.8 may be coupled in band to channel coupling matrixes 5.7; 5.8 respectively allowing the number of bands from the filter banks 2.7; 2.8 to differ from the number K and L of slow and fast channels 7, 8 respectively.

Figure 4:
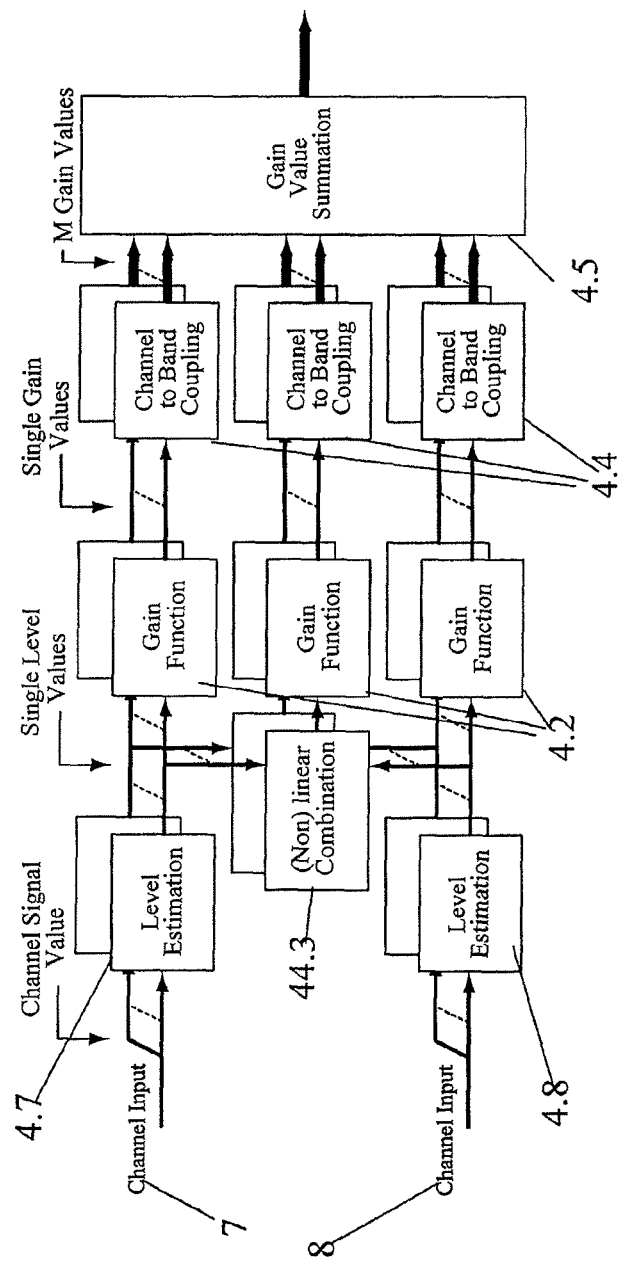
FIG. 4: One compressor slice with multiple level estimators and multiple gain tables.

The second part in the control path is the level estimation and gain table part assigned reference number 4 in FIG. 1. A general system is illustrated in FIG. 4 displaying one compressor slice with multiple level estimators 4.7, 4.8 and multiple gain tables or gain functions 4.2. For each of the K slow channel inputs 7 slow acting level estimators 4.7 are provided and for each of the L fast channel inputs 8 fast acting level estimators 4.8 are provided. Further, Gain Functions 4.2 are provided for each of the Level estimators 4.7 and 4.8. A unique gain function 4.2 may be used for each level estimator. Also a (non)linear combination 4.3 of level estimates can be used for gain table lookup. Single Gain Values are supplied from the Gain Functions 4.2. The Single Gain Values are translated to frequency bands in Cannel to Band coupling block 4.4 and in summation block 4.5, finally the gains for each frequency band are summed up. Examples of such systems are given in the next section.

Parallel Double Compression

Figure 5:
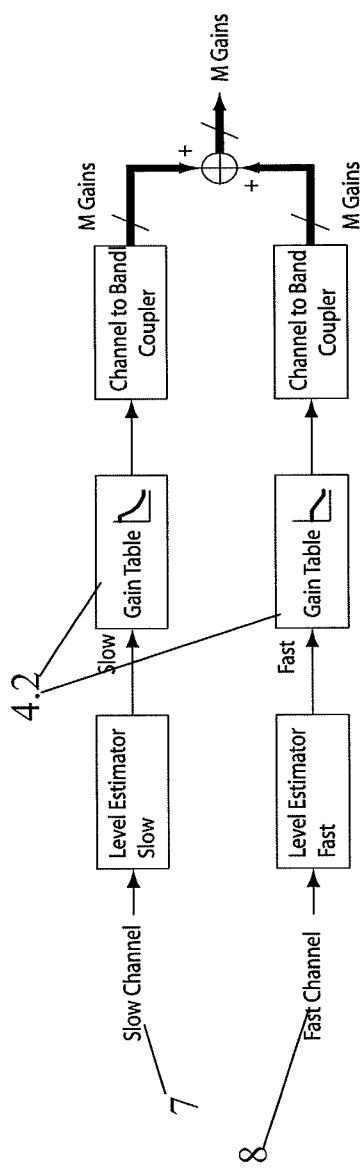
FIG. 5: Parallel Double Compression.

The first example shows Parallel Double Compression with two sets of level estimators and two gain tables, see FIG. 5. One level estimator set has large time constants corresponding to slow channels and the other level estimator set has small time constants corresponding to fast channels.

The gain curves 4.2 in FIG. 5 shows the two gain function which will be applied to the slow 7 and fast 8 channels respectively and they corresponds to the gain functions 4.2 in FIG. 4. In the slice displayed in FIG. 4 only one slow and one fast channel is shown, where FIG. 5 the path for all slow and fast channels is displayed. The gain tables 4.2 of FIG. 5 are set such that that the static curve is still identical. In this example both slow and fast gain is expressed at the same kneepoints which correspond to those of the static gain, see FIG. 6. However, the kneepoints can also differ. The sum of the slow and fast gain curves is the static gain curve.

Figure 6:
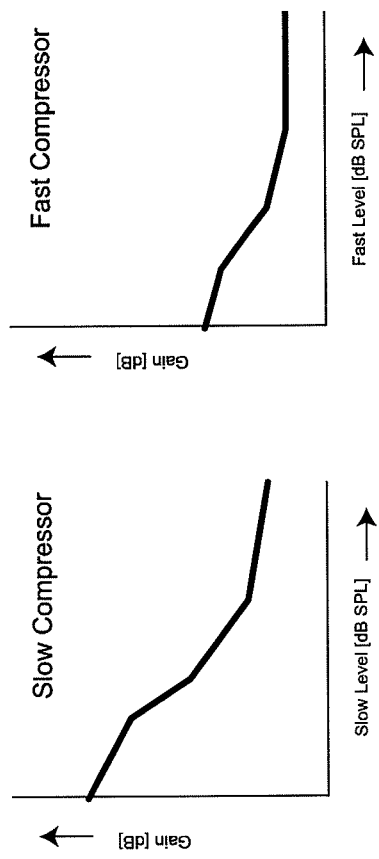
FIG. 6: Gain Curves for Parallel Double Compression.

In FIG. 6 an example of a slow compression gain table is shown in the graph marked "Slow Compressor". This gain is applied in many narrow frequency bands hence the band-to-channel coupling for the slow channel is set accordingly. This allows for a precise matching of hearing loss to signals and good comfort even if narrow band signals are present.

The slow level estimates are used in the usual way to look up in a gain table, thus specifying the slow gain. The slow gain acts as an automatic volume control. The compression ratio can be high to match the auditory dynamic range to the range of input levels, e.g. up to 4 for severe hearing losses.

Slow compression gain is simply the static gain minus the fast gain—at each map specification frequency.

Fast compression: The fast compression uses few channels e.g. 2-4 channels. An example of the fast compression gain table is shown in FIG. 6 in the graph marked "Fast Compressor". These broader channels have fast responses to sudden impulses and maintain the spectral cues in the signal. The fast level estimates are fed to separate gain tables to look up the fast gain.

The slow and fast gains are added to form the total gain of the system. The resulting steady-state gain curve reflects the total gain and this is expected to match the gain curve specified by the rationale and identical to the traditional 'single' compression.

Fast compression gain is calculated as 20-40% of the static gain in each kneepoint at 50 dB SPL (in the channel) and above, and the percentage is regulated according to the need of the user. When the fast compression represents a larger fraction of the static gain more of the sudden changes in the sound level will be reflected and more sound cues will be given which may help some users to better speech understanding. The fast compression uses the same number of gain tables as filter bands, i.e. 4 tables for 4 level estimators. Before calculating the fast gain values from the static gain, the static gain is averaged within the map specification frequencies that are within the corresponding fast channel. The fast and slow gains are added using the same principle. The slow compression may also use as many gain tables as channels.

The gain below 65 dB SPL (broadband speech) is kept constant. This kneepoint is high enough to avoid interference with the anti-feedback system and it corresponds to speech in quiet. Thus, the fast compression will engage when the speech level is raised due to surrounding noise.

The fast compression kneepoints are identical to the highest 4 of the 6 kneepoints used: 50, 65, 80 and 105 dB SPL. The compression ratios typically are 1.5 or less.

The fast time constants are meant to be fast—similar to or faster than those for fast-type single compression. The release time is longer than the attack time. Using only 4 channels and moderate compression ratios will result in very low compression distortion.

Serial Double Compression

Figure 7:
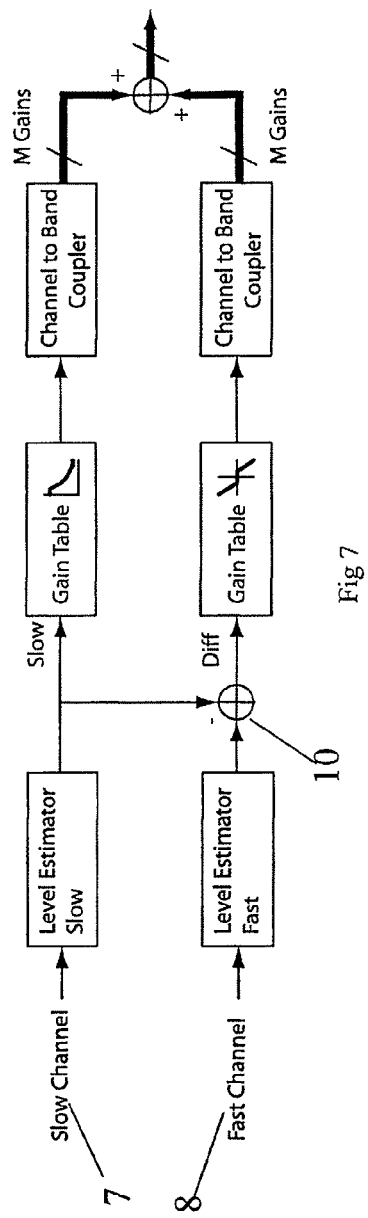
FIG. 7: Serial Double Compression.

In serial double compression, a level difference is computed at summation point 10 between the slow and fast levels. The slow gain estimates (marked "Slow" in FIG. 7) and the difference level (marked "Diff" in FIG. 7) estimates are then fed to two different gain tables, see FIG. 7.

Slow compression: The slow compression gain curve in this example is set equal to the static gain curve. Filter bank and time constants are set in a same manner as for the slow part of the parallel double compressor. An example of a slow gain curve is displayed in FIG. 8 in the graph marked "Slow Compressor.

Figure 8:
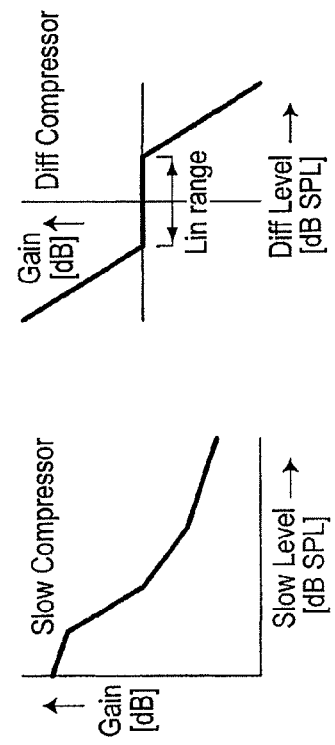
FIG. 8: Gain Curves for Serial Double Compression.

The difference compression gain curve is shown in FIG. 8 in the graph marked "Diff Compressor". This gain table maps positive level difference to a proportional negative gain and conversely negative level difference to a proportional positive gain. Around zero dB difference there can be a range (linear range) where the fast compressor does not act and thus the system acts as a linear system only providing stable gain.

Figure 9:
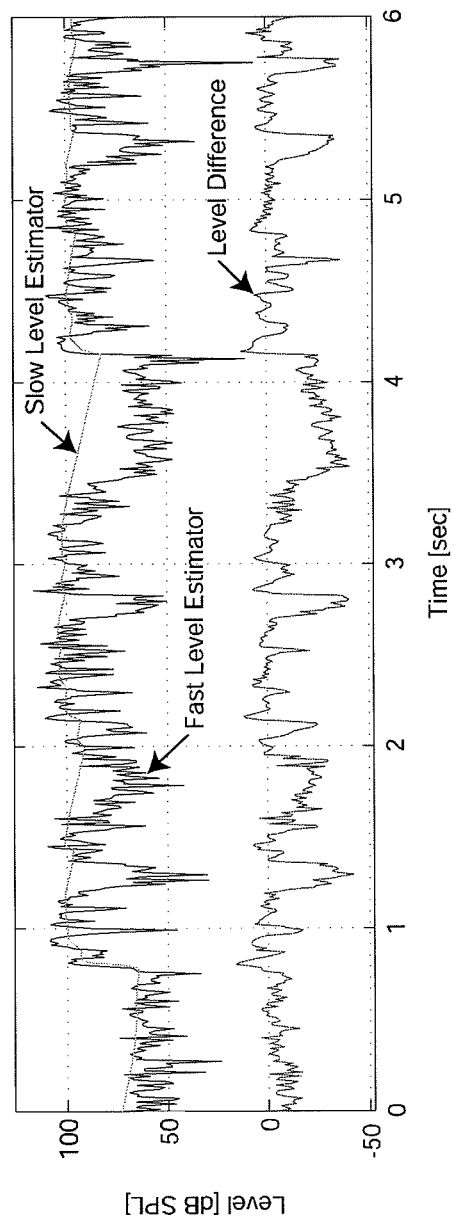
FIG. 9: Slow, fast and difference level estimates for a speech signal.

An example of slow, fast and difference levels varying as a function of time are illustrated in FIG. 9, for a speech signal. The fast level estimator curve and the slow estimator curve are at the top where the fast level estimator curve fluctuates as predictable and the slow estimator staying steadily at the top part of the fluctuating fast level estimator. The difference curve between the two is seen at the lover part of the graph.

The difference compressor parameters (pos and neg knee-points and slopes) could be made level dependent in order to enhance the performance and provide improved compression with less signal distortion. They could also be made dependent on (non)linear functions of level estimates, such as modulation index.

Triple Compression

Figure 10:
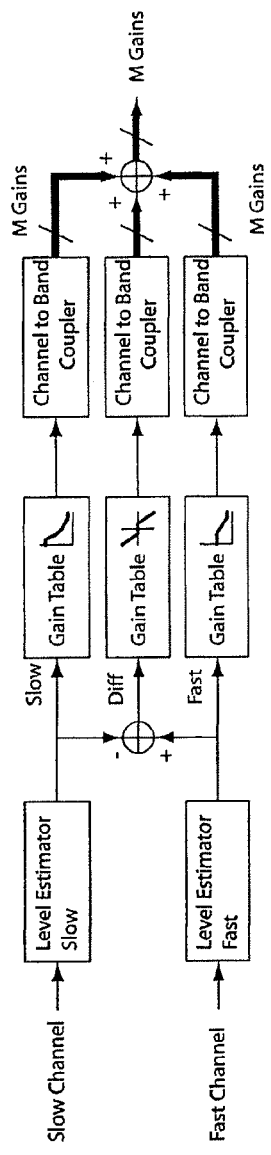
FIG. 10: Triple Compression, a combination of Parallel and Serial Double Compression.

Triple compression is basically the same as parallel double compression with its gain curve settings but with a difference level gain table added. This is illustrated in FIG. 10. This is an example of the use of a (non)linear function of two level estimates (see FIG. 4).

Figure 11:
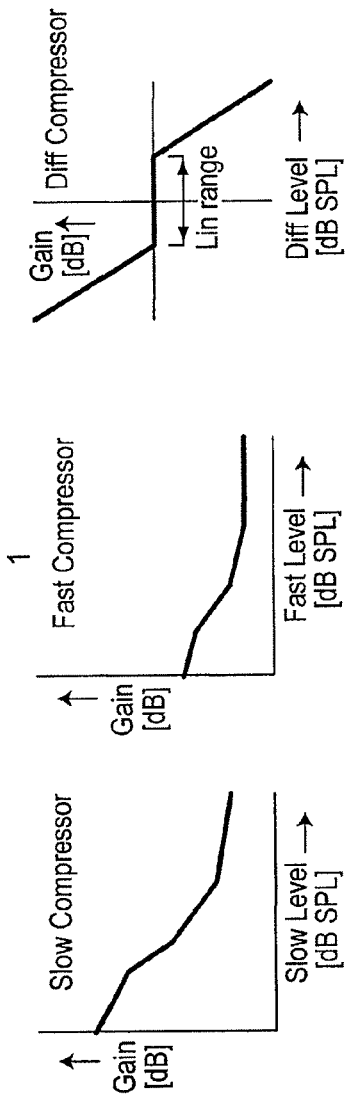
FIG. 11: Gain Curves for Triple Compression.

The triple compression setup can also be viewed as a serial double compressor where the slow gain curve is split into a fast and slow part. However, the difference level gain curve should be a percentage of the difference level gain curve for the serial double compressor, typically the same percentage as the slow level compressor in the parallel double compressor. For example: when the slow/fast percentages are 60/40% then the difference level gain curve should be 60% of the gain curve in the case of the serial difference compressor. The gain curves for the triple compressor are illustrated in FIG. 11.

Figure 12:
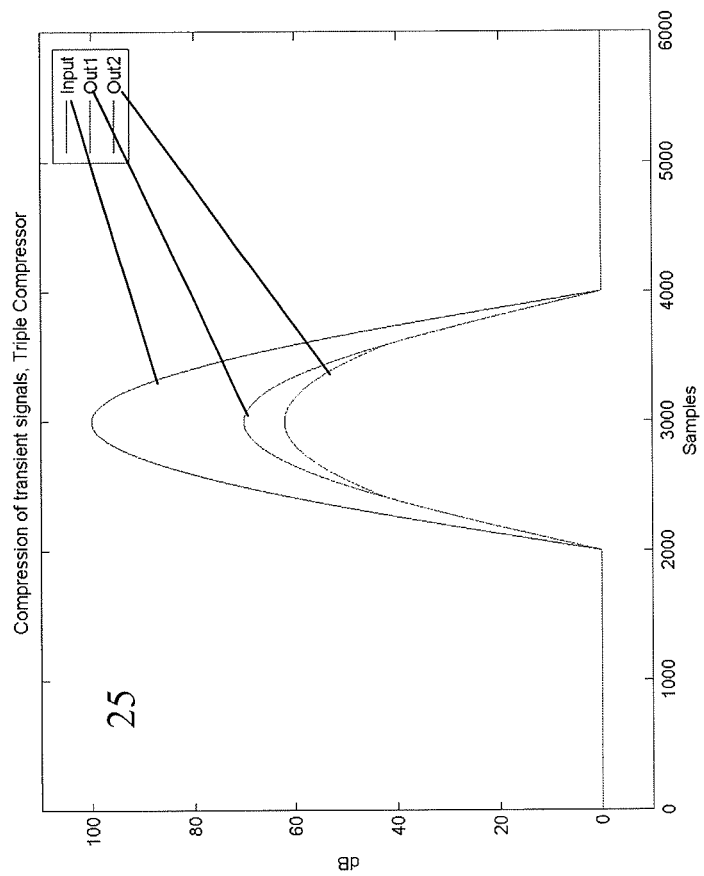
FIG. 12: Compression of transient signals in a triple compressor.

The goal of splitting the compression system into multiple level estimators and multiple gain tables becomes most clear with the explanation of FIG. 12 below. The slow compressor acts as a slowly varying automatic volume control which controls the loudness perception. The fast compressor controls instant speech compression, which increases the speech intelligibility. The difference compressor positive gain provides the possibility of instant "listening in the dips", while the negative gain controls the protection against transients. The effect on transients is illustrated in FIG. 12 where the blue line at the top is the input level (Input). The green line in the middle is the output level in the case of parallel double compression (Out 1). The red line below is the output level in the case of triple compression (Out 2).

Binaural Synchronization

Traditionally, the compressors in each instrument act independently based on the sound level at each ear. Consider a sound source to one side of the listener. The ipse lateral ear will detect a higher level than the contra lateral ear which is hidden in the 'head shadow'. This is the interaural level difference. Therefore the gain in the two sides will differ, and the original interaural level difference presented to the listener is reduced when each ear is assisted by a hearing aid, due to the compressor scheme in the hearing aids. For the listener this means reduced ability to localize the sound sources in a room and reduced ability to separate speech from simultaneous speakers. The result is reduced speech understanding in complex environments, e.g. a party situation.

The invention uses the binaural wireless link to exchange slow RMS level estimates between the two ears such that the slow-acting part of the compression system is synchronized between the two ears. The result for the user is a more stable sound image, improved localization and improved speech intelligibility in noise.

Figure 14:
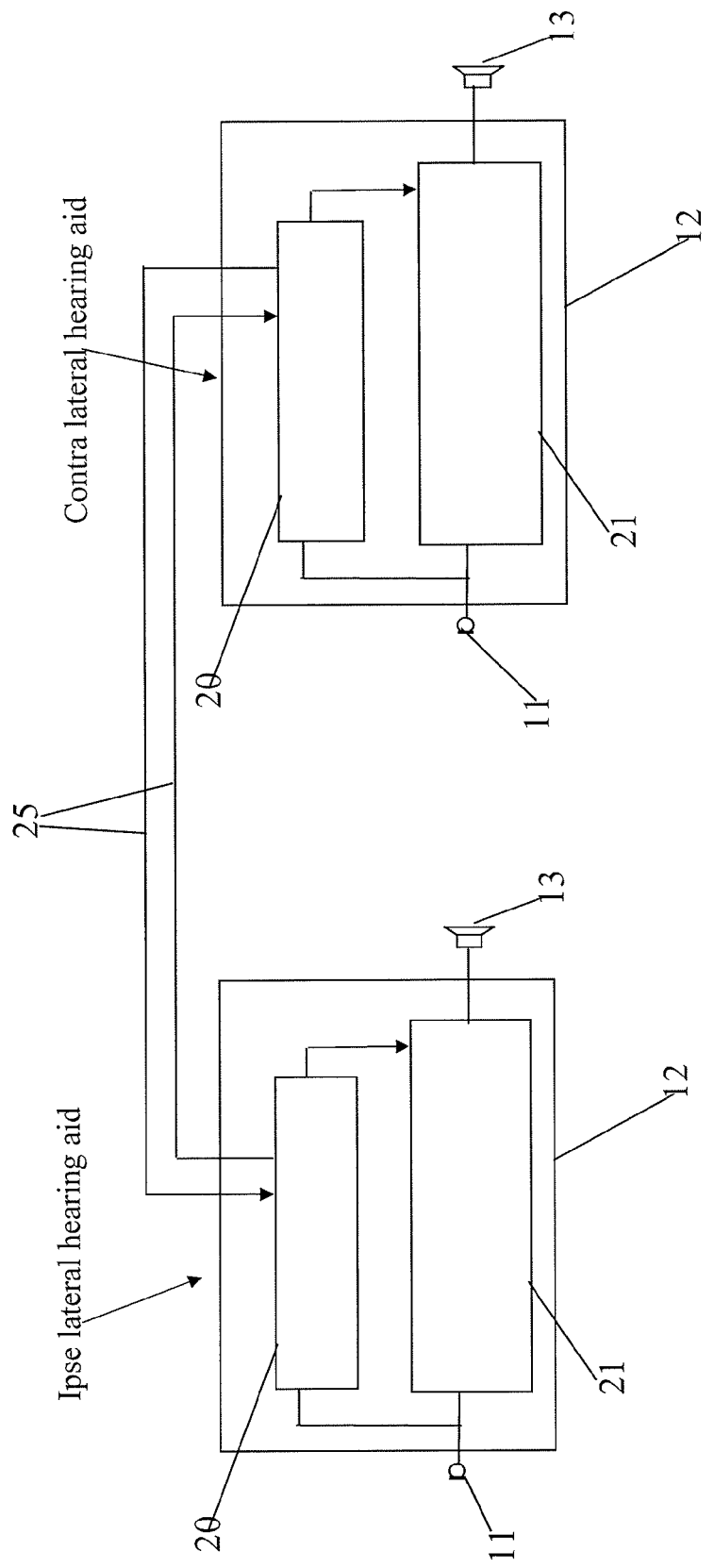
FIG. 14: Schematic view of a pair of hearing aids according to the invention.

The slow compression can be synchronized via a binaural wireless link 25 as seen in FIG. 14 and thus maintain proper interaural level difference (ILD), which ensures better localization and communication in noisy environments. Both instruments receive level estimates from the opposite ear, and a function of both level estimates is used to control the slow gain table. An example of such a function could be the linear combination $$f(L,R) = \alpha L + \beta R, \alpha, \beta \in [0,1]$$

where L and R denote the left and right slow level estimates, respectively, and $\alpha, \beta$ are weighting constants. Nonlinear function would also be possible such as different linear combinations for different levels. Usually $$\alpha \in [0,1] \text{ and } \beta = 1 - \alpha$$

During normal function of the hearing aid pair in question the weight of own ear value is between ½ and 1 and the weight of opposite ear weight is correspondingly between ½ and 0. Weighting is fully configurable. If the link status changes, the weighting is faded against the new target using a programmable time constant.

Figure 15:
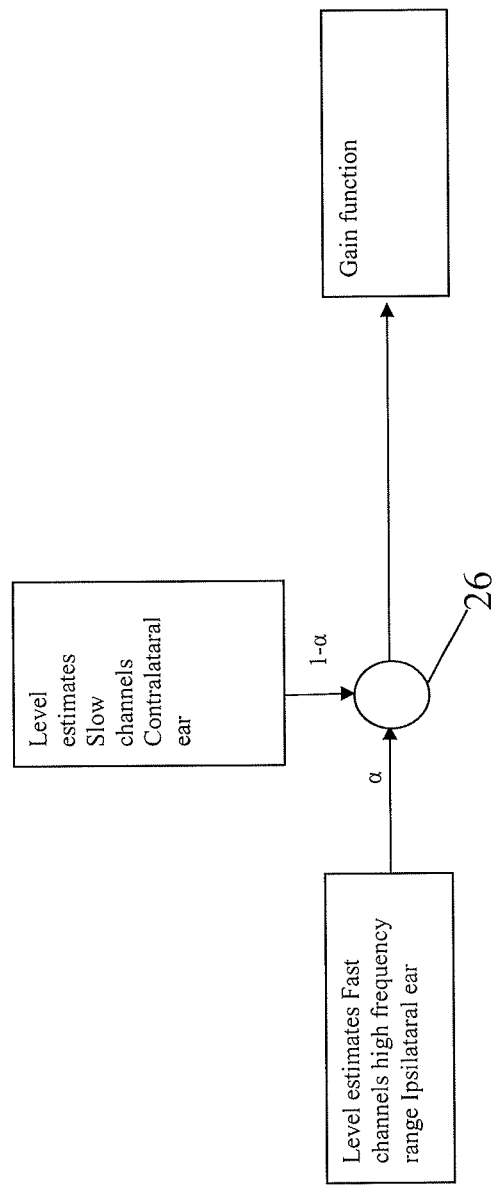
FIG. 15: Schematic view of the combination of signals from the two hearing aids.

FIG. 15 shows how the level estimates at the ipse lateral ear for the slow channels, but only the high frequency ranges is coupled with the corresponding level estimates from the contra lateral ear, and combined to form an average using a simple function. A summation point 26 will be added in the slow channels above 1500 Hz for this purpose. The resulting level estimate is used to determine the applicable gain according to the gain function as seen in FIG. 15.

In order to assure a stable sound picture for the user having a hearing aid in each ear, it is advantageous to only combine left and right ear level estimates for frequencies above a certain level. It has been shown that users benefit the most from the combination of right and left ear level estimates if only level estimates for frequencies above 1500 Hz are used.

In the absence of the binaural link, due to monaural fitting or interrupted communication, the instruments work locally in the ordinary manner.

The invention claimed is:

1. A hearing aid, comprising:
    an audio signal input device;
    a signal processor; and
    a signal output device which presents a processed audio signal perceivable as sound to an ear of a user, wherein
    the signal processor includes
        fast acting level estimators and
        slow acting level estimators,
    the hearing aid further comprises a binaural communication link operable to transmit and receive data to/from a second, similar, contralaterally placed hearing aid providing sound to a contralateral ear of a user,
    the binaural communication link is operative to transmit level estimates from only the slow level estimators in each of the two hearing aids to the respective contralaterally placed hearing aid, and
    a summation point is provided in each hearing aid operative to combine the level estimates of the ipsilateral hearing aid with the level estimates of the contralateral hearing aid, received via the binaural communication link, according to a summation function.

2. The hearing aid according to claim 1, wherein the summation function comprises a linear combination.

3. The hearing aid according to claim 2, wherein only level estimates in frequency bands comprising frequencies above 1500 Hz are transmitted between the ipsilateral hearing aid and the contralateral hearing aid and only for these bands the level estimates are combined.

4. The hearing aid according to claim 1, wherein only level estimates in frequency bands comprising frequencies above 1500 Hz are transmitted between the ipsilateral hearing aid and the contralateral hearing aid and only for these bands the level estimates are combined.

5. The hearing aid according to claim 1, wherein the signal processor comprises:
   a signal path having a synthesis filter operative to provide gain modifications in frequency bands; and
   a control path having a filter operative to split the input signal into frequency bands and level estimators operative to estimate signal levels in channels where each channel comprises at least one frequency band, wherein the gain modifications in the synthesis filter in the signal path are controlled by the estimated signal levels in the control path.

6. The hearing aid according to claim 2, wherein the signal processor comprises:
   a signal path having a synthesis filter operative to provide gain modifications in frequency bands; and
   a control path having a filter operative to split the input signal into frequency bands and level estimators operative to estimate signal levels in channels where each channel comprises at least one frequency band, wherein the gain modifications in the synthesis filter in the signal path are controlled by the estimated signal levels in the control path.

7. The hearing aid according to claim 3, wherein the signal processor comprises:
   a signal path having a synthesis filter operative to provide gain modifications in frequency bands; and
   a control path having a filter operative to split the input signal into frequency bands and level estimators operative to estimate signal levels in channels where each channel comprises at least one frequency band, wherein the gain modifications in the synthesis filter in the signal path are controlled by the estimated signal levels in the control path.

8. The hearing aid according to claim 4, wherein the signal processor comprises:
   a signal path having a synthesis filter operative to provide gain modifications in frequency bands; and
   a control path having a filter operative to split the input signal into frequency bands and level estimators operative to estimate signal levels in channels where each channel comprises at least one frequency band, wherein the gain modifications in the synthesis filter in the signal path are controlled by the estimated signal levels in the control path.

9. The hearing aid according to claim 5, wherein the filter of the control path comprises:
   a first filter operative to effect a band split operation of the input signal into a number of frequency bands, not less than 10; and
   a further filter operative to effect a band split operation of the input signal into a number of frequency bands not exceeding 8 in parallel with the first filter.

10. The hearing aid according to claim 6, wherein the filter of the control path comprises:
   a first filter operative to effect a band split operation of the input signal into a number of frequency bands, not less than 10; and
   a further filter operative to effect a band split operation of the input signal into a number of frequency bands not exceeding 8 in parallel with the first filter.

11. The hearing aid according to claim 7, wherein the filter of the control path comprises:
   a first filter operative to effect a band split operation of the input signal into a number of frequency bands, not less than 10; and
   a further filter operative to effect a band split operation of the input signal into a number of frequency bands not exceeding 8 in parallel with the first filter.

12. The hearing aid according to claim 8, wherein the filter of the control path comprises:
   a first filter operative to effect a band split operation of the input signal into a number of frequency bands, not less than 10; and
   a further filter operative to effect a band split operation of the input signal into a number of frequency bands not exceeding 8 in parallel with the first filter.

13. The hearing aid according to claim 5, wherein the filter of the signal path comprises:
   a first filter operative to effect a band split operation of the input signal into a number of frequency bands, not less than 10; and
   a band grouping matrix operative to combine the frequency bands from the first filter into:
   a first group of channels spanning the desired frequency range of the output signal and comprising not more than 8 channels, and
   a second group of channels spanning the desired frequency range of the output signal comprising not less than 10 channels.

14. The hearing aid according to claim 6, wherein the filter of the signal path comprises:
   a first filter operative to effect a band split operation of the input signal into a number of frequency bands, not less than 10; and
   a band grouping matrix operative to combine the frequency bands from the first filter into:
   a first group of channels spanning the desired frequency range of the output signal and comprising not more than 8 channels, and
   a second group of channels spanning the desired frequency range of the output signal comprising not less than 10 channels.

15. The hearing aid according to claim 7, wherein the filter of the signal path comprises:
   a first filter operative to effect a band split operation of the input signal into a number of frequency bands, not less than 10; and
   a band grouping matrix operative to combine the frequency bands from the first filter into:
   a first group of channels spanning the desired frequency range of the output signal and comprising not more than 8 channels, and
   a second group of channels spanning the desired frequency range of the output signal comprising not less than 10 channels.

16. The hearing aid according to claim 8, wherein the filter of the signal path comprises:
   a first filter operative to effect a band split operation of the input signal into a number of frequency bands, not less than 10; and
   a band grouping matrix operative to combine the frequency bands from the first filter into:
   a first group of channels spanning the desired frequency range of the output signal and comprising not more than 8 channels, and
   a second group of channels spanning the desired frequency range of the output signal comprising not less than 10 channels.

* * * * *